(12) United States Patent
Garg et al.

(10) Patent No.: US 10,014,877 B1
(45) Date of Patent: Jul. 3, 2018

(54) MULTI-SEGMENTED ALL LOGIC DAC

(71) Applicant: Avago Technologies General IP (Singapore) Pte. Ltd., Singapore (SG)

(72) Inventors: Adesh Garg, Aliso Viejo, CA (US); Ali Nazemi, Aliso Viejo, CA (US); Jiawen Zhang, Irvine, CA (US); Burak Catli, Costa Mesa, CA (US); Anand J. Vasani, Laguna Hills, CA (US); Jun Cao, Irvine, CA (US); Jan Mulder, Houten (NL); Jan Westra, Uithoorn (NL)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/694,259

(22) Filed: Sep. 1, 2017

(51) Int. Cl.
 *H03M 1/66* (2006.01)
 *H03M 1/68* (2006.01)
(52) U.S. Cl.
 CPC ............. *H03M 1/68* (2013.01); *H03M 1/682* (2013.01)
(58) Field of Classification Search
 CPC ................... H03M 1/68; H03M 1/682
 USPC ................................... 341/144, 145
 See application file for complete search history.

(56) References Cited

U.S. PATENT DOCUMENTS

| | | | | |
|---|---|---|---|---|
| 6,650,265 B1* | 11/2003 | Bugeja | ................. | H03M 1/002 341/131 |
| 7,173,552 B1* | 2/2007 | Garcia | ................ | H03M 1/0678 341/120 |
| 7,952,507 B2* | 5/2011 | Katsis | .................... | H03M 1/70 341/120 |
| 9,178,524 B1* | 11/2015 | Lee | ..................... | H03M 1/0612 |

* cited by examiner

*Primary Examiner* — Brian Young
(74) *Attorney, Agent, or Firm* — Oblon, McClelland, Maier & Neustadt, L.L.P.

(57) ABSTRACT

A digital-to-analog converter (DAC) includes a plurality of segments, wherein the plurality of segments includes a first segment electronically coupled to each of the plurality of segments, wherein the first segment includes a predetermined number of most significant bits (MSB), a second segment electronically coupled to each of the plurality of segments, wherein the second segment includes a first predetermined number of least significant bits (LSB), and a third segment electronically coupled with each of the plurality of segments, wherein the third segment includes a second predetermined number of LSBs. Additionally, the DAC includes an all logic implementation.

17 Claims, 5 Drawing Sheets

MULTI-SEGMENTED ALL LOGIC DAC

FIELD OF THE DISCLOSURE

The present disclosure relates generally to a system and associated methodology for digital to analog conversion.

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Real-world analog signals such as temperature, pressure, sound, or images are routinely converted to a digital representation that can be easily processed in modern digital systems. In many systems, this digital information must be converted back to an analog form to perform some real-world function. The circuits that perform this step are digital-to-analog converters (DACs), and their outputs are used to drive a variety of devices. As part of their operation, one or more of the variety of devices may require a highly linear, high precision, and high speed DAC which are difficult to implement with traditional current steering DACs.

SUMMARY

The foregoing paragraphs have been provided by way of general introduction, and are not intended to limit the scope of the following claims. The described embodiments, together with further advantages, will be best understood by reference to the following detailed description taken in conjunction with the accompanying drawings.

According to embodiments of the disclosed subject matter, a digital-to-analog converter (DAC) includes a plurality of segments, wherein the plurality of segments includes a first segment electronically coupled to each of the plurality of segments, wherein the first segment includes a predetermined number of most significant bits (MSB), a second segment electronically coupled to each of the plurality of segments, wherein the second segment includes a first predetermined number of least significant bits (LSB), and a third segment electronically coupled with each of the plurality of segments, wherein the third segment includes a second predetermined number of LSBs. Additionally, the DAC includes an all logic implementation.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
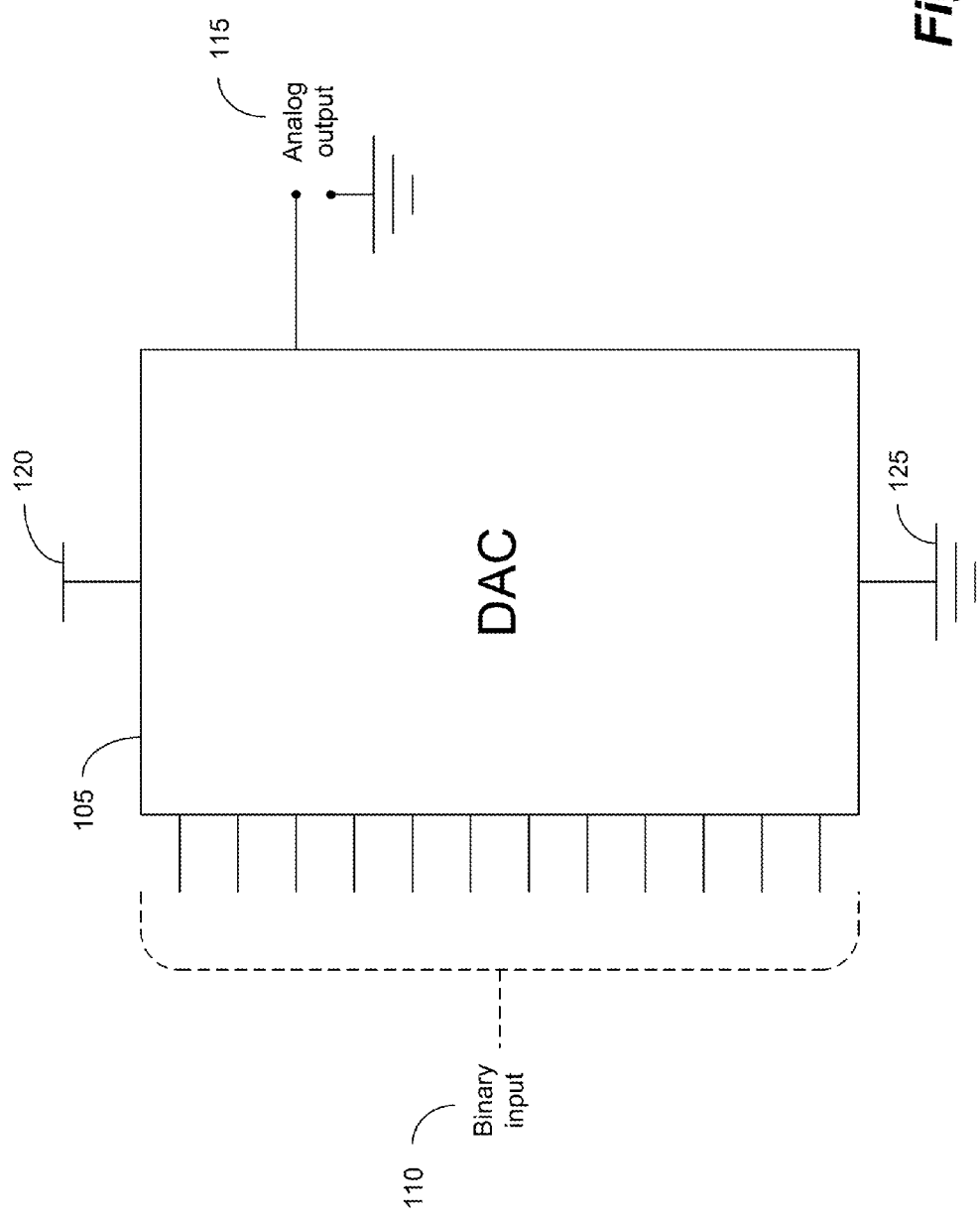
FIG. 1 depicts an exemplary overview of a digital-to-analog converter (DAC) according to one or more aspects of the disclosed subject matter.

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "left," "right," "top," "bottom," "front," "rear," "side," "height," "length," "width," "upper," "lower," "interior," "exterior," "inner," "outer," and the like that may be used herein, merely describe points of reference and do not necessarily limit embodiments of the disclosed subject matter to any particular orientation or configuration. Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

Referring now to the drawings, wherein like reference numerals designate identical or corresponding parts throughout the several views.

FIG. 1 depicts an exemplary overview of a digital-to-analog convertor 105 (DAC) according to one or more aspects of the disclosed subject matter. The DAC 105 can receive binary input 110 (e.g., digital input) and convert the binary input 110 to an analog output signal (e.g., analog output 115). Additionally, the DAC 105 can be connected to a positive voltage supply 120 and a ground 125, for example. More specifically, the DAC 105 can be a multi-segmented all logic DAC as further described herein. DACs can be used to drive a variety of devices including loudspeakers, video displays, motors, mechanical servos, radio frequency transmitters, and the like. However, some applications require high-resolution, for example, in which the architecture of the DAC can play a significant role in the success of the DAC in the high-resolution application.

Generally speaking, the multi-segmented all logic DAC 105 can be a highly linear, high precision, and high speed DAC which can be advantageous in many current applications including high speed transmitters, for example. More specifically, the multi-segmented all logic DAC 105 can provide reduced area, lower power consumption, significant scalability, and unmatched linearity and speed compared to current architectures including current steering DACs and binary voltage mode DACs, for example.

The current steering architecture of a differential current steering DAC can switch a current through a fixed load. As a result, at high resolution the current accuracy needs to be sub-microamperes which approaches a noise limit of the differential current steering DAC. Additionally, the device operation of the switches must be well controlled to maintain linear operation. For example, at high resolution this requires multiple staked devices limiting bandwidth, thereby increasing the required supply voltage and increasing power consumption. Further, for high resolution DACs that need to be effectively 50 ohms, the LSB resistor has to be very large which can significantly affect the overall bandwidth, for example.

However, the multi-segmented all logic DAC 105 provides various circuit, system, and product advantages as further described herein. The segmentation can provide significant flexibility, thereby optimizing the DAC architecture for various applications.

Figure 2:
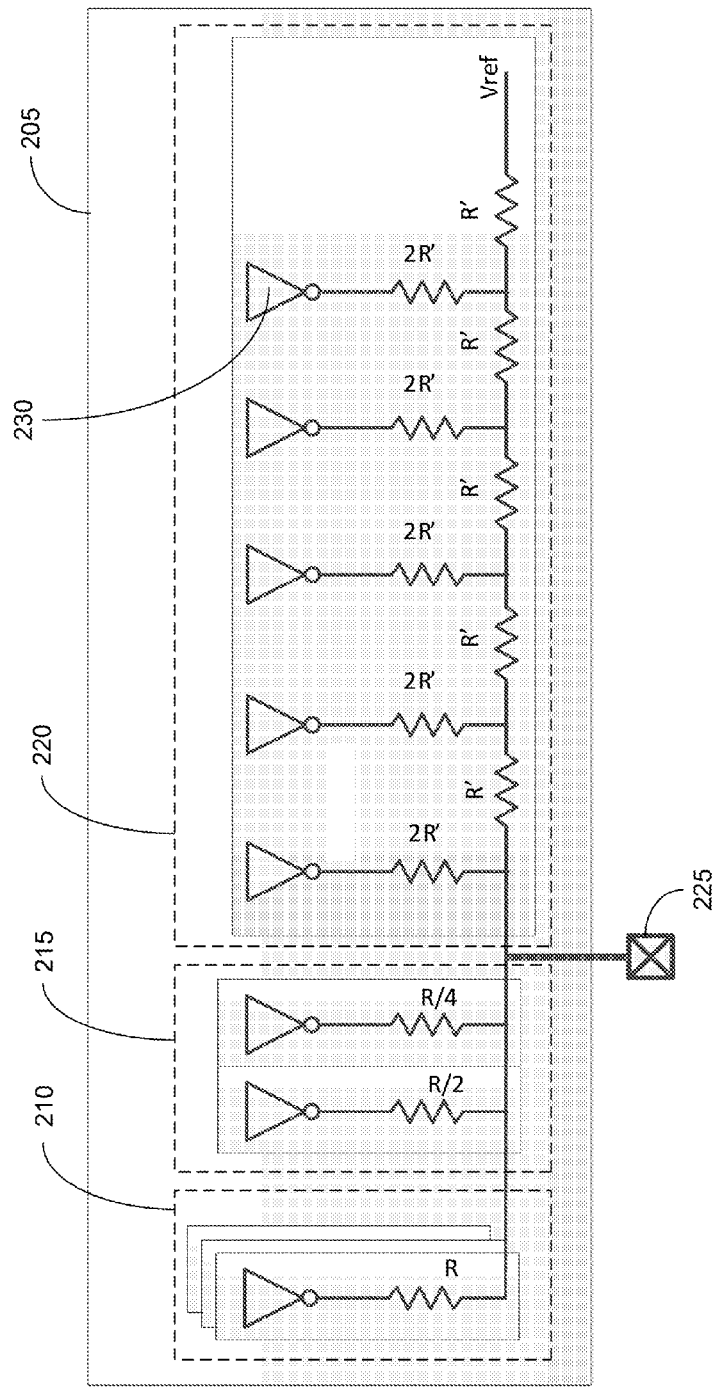
FIG. 2 depicts an exemplary block diagram of a multi-segmented all logic DAC according to one or more aspects of the disclosed subject matter.

FIG. 2 depicts an exemplary block diagram of a multi-segmented all logic DAC 205 (referred to herein as DAC 205) according to one or more aspects of the disclosed subject matter. The logic of the DAC 205 can be a complementary metal-oxide-semiconductor (CMOS), for example, such that the DAC 205 is a multi-segmented all CMOS DAC. Alternatively, or additionally, the logic can be N-type metal-oxide-semiconductor (NMOS), P-type metal-oxide-semiconductor PMOS, and the like, for example. The DAC 205 can be an n-bit DAC, for example, wherein the n-bit DAC can correspond to a predetermined number of total bits. The segmentation for the DAC 205 can include a first segment 210, a second segment 215, and a third segment 220, such that the bits of each segment can add up to n-bits. Additionally, the DAC 205 can provide output to a node 225. The node 225 can be a summing node or an operational amplifier, for example. The DAC 205 can a logic gate 230 for each input, for example. In an embodiment, each logic gate 230 can be a CMOS gate. CMOS gates can use complementary and symmetrical pairs of p-type and n-type metal oxide semiconductor field effect transistors for logic functions. As a result, CMOS devices (e.g., the DAC 205) have high noise immunity and low static power consumption. In other words, each resistor can be connected to a logic-1 or logic-0, for example, which can allow for digital to analog conversion.

The first segment 210 can correspond to x MSB bits, wherein x can correspond to a predetermined number of MSB bits. The x MSB bits of the first segment 210 can be thermometer encoded which can allow for various signal processing/coding techniques (e.g., dynamic element matching) to be used on the DAC 205. The thermometer encoding can provide high speed and high precision, for example. The thermometer encoded. MSBs of the first segment 210 can be composed of a corresponding number of unit-weighted slices based on the number of MSBs.

The second segment 215 can correspond toy LSBs which can be binary encoded, wherein y can correspond to a predetermined number of LSB bits. For example, the y LSB bits can be created from parallel matched units from the thermometer encoded bits from the first segment 210.

The third segment 220 can correspond to z LSB bits, wherein z LSB bits can use an R-2R DAC structure, wherein z can correspond to a predetermined number of LSB hits. The R-2R DAC structure of the third segment 220 can increase the bandwidth limitation for the lower LSB bits with low RC time constants (i.e., working at a fast rate). Additionally, the R-2R DAC structure of the third segment 220 can have a smaller area than a traditional binary structure. In an embodiment, R' can be less than R, for example.

Figure 3:
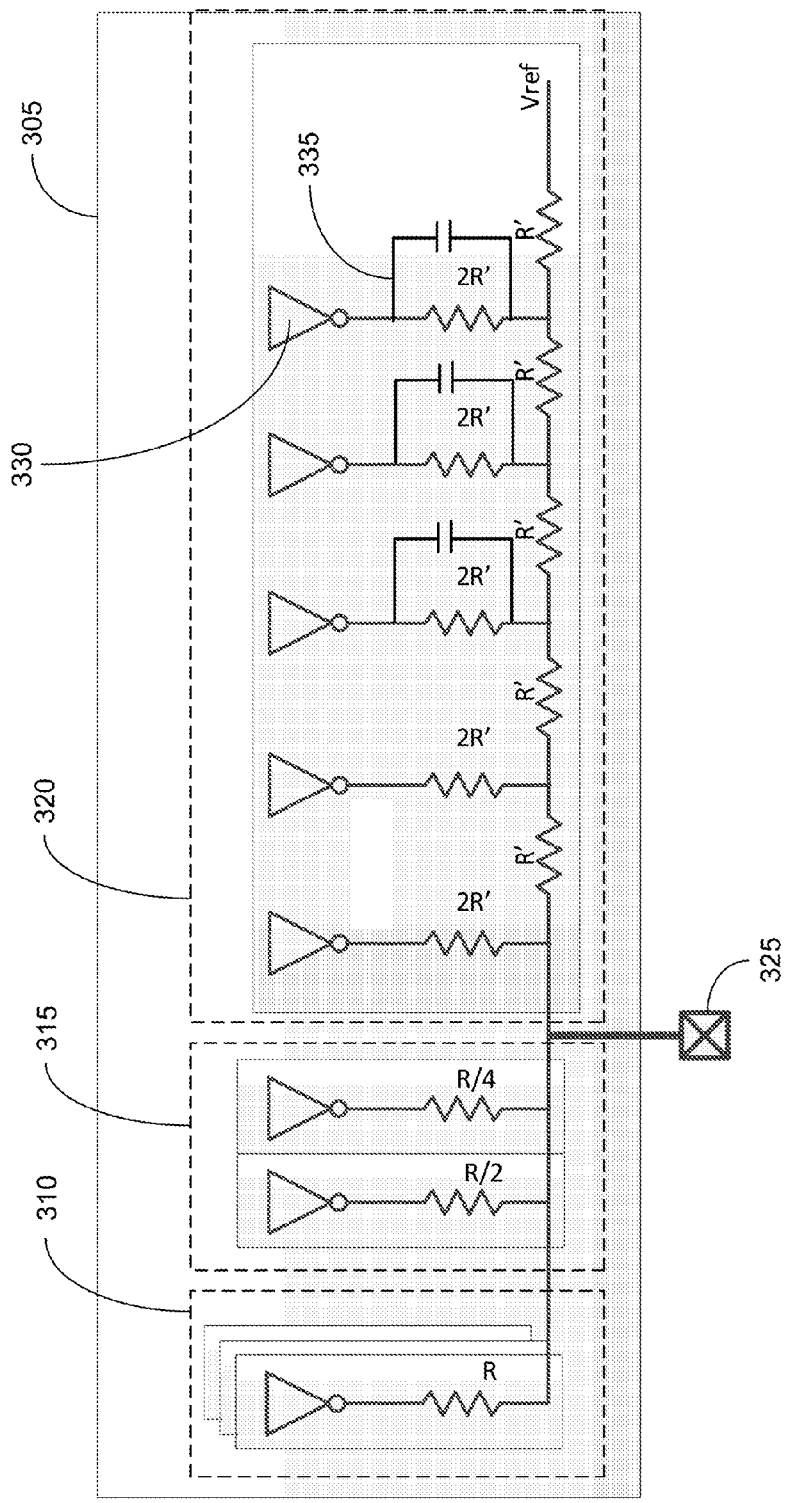
FIG. 3 depicts an exemplary block diagram of a multi-segmented all logic DAC including further bandwidth enhancement according to one or more aspects of the disclosed subject matter.

FIG. 3 depicts an exemplary block diagram of a multi-segmented all logic DAC 305 (referred to herein as DAC 305) including further bandwidth enhancement according to one or more aspects of the disclosed subject matter. The DAC 305 can be an exemplary implementation of the n-bit DAC 205 described in FIG. 2, for example. The segmentation for the DAC 305 can include a first segment 310, a second segment 315, and a third segment 320. Additionally, the DAC 305 can provide output to a node 325. The node 325 can be a summing node or an operational amplifier, for example. The DAC 305 can logic gate 330 for each input. In an embodiment, the logic gates 330 can be one or more of a CMOS gate, an NMOS gate, a MOS gate, and the like.

The first segment 310 and the second segment 315 can function as described in FIG. 2 regarding the first segment 210 and the second segment 215, for example.

Additionally, the DAC 305 includes further bandwidth enhancement. The further bandwidth enhancement can be provided by one or more capacitors 335. The DAC 305 can include three capacitors 335, for example. The one or more capacitors 335 can be scaled and placed across the R-2R structure of the third segment 320. For example, the one or more capacitors 335 can be placed on the LSBs 2 to 0. The one or more capacitors 335 placed across the R-2R structure of the third segment 320 can decrease the dynamic/high speed DAC quantization noise due to segmentation. Alternatively, or additionally, the one or more capacitors 335 can be placed across the first segment 310 and/or the second segment 315 to further enhance a specific segment of the DAC 305, for example.

Figure 4:
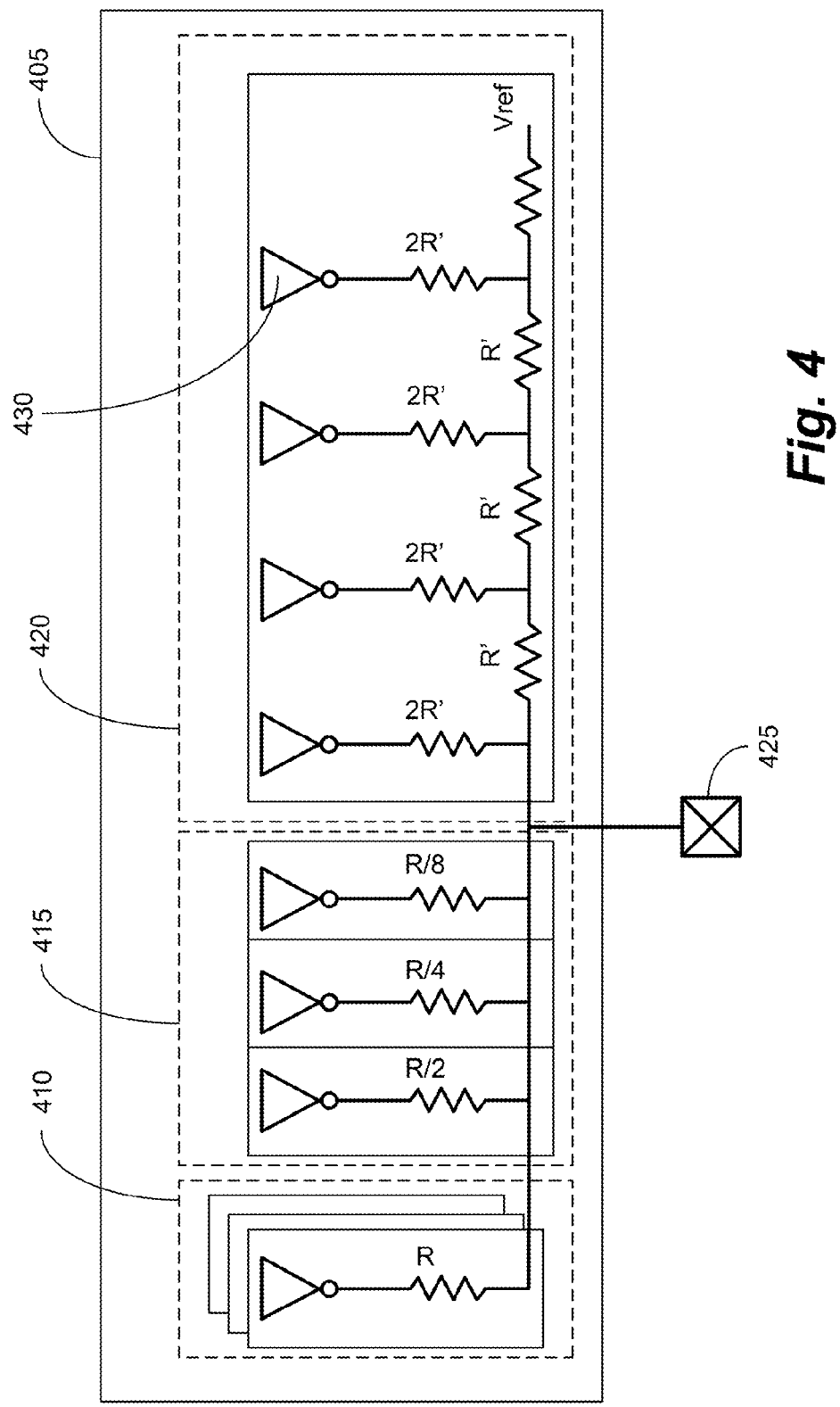
FIG. 4 depicts an exemplary block diagram of a multi-segmented all logic DAC according to one or more aspects of the disclosed subject matter.

FIG. 4 depicts an exemplary block diagram of a multi-segmented all logic DAC 405 (referred to herein as DAC 405) according to one or more aspects of the disclosed subject matter. The DAC 405 can be an exemplary implementation of the n-bit DAC 205 described in FIG. 1, for example. In an embodiment, the DAC 405 can include 7 MSBs and 7 LSBs, for example. The segmentation for the DAC 405 can include a first segment 410, a second segment 415, and a third segment 420. Additionally, the DAC 405 can provide output to a node 425. The node 425 can be a summing node or an operational amplifier, for example. The DAC 405 can include a logic gate 430 for each input. Additionally, it should be appreciated that one or more of the segments can include one or more capacitors as described in FIG. 3.

The first segment 410 can function as described in FIG. 2 regarding the first segment 210, for example.

The second segment 415 can include three LSBs (e.g., LSB 6, LSB 5, and LSB 4) which are binary encoded. For example, the LSB bits 6, 5, and 4 can be created from parallel matched units from the thermometer encoded bits from the first segment 410.

The third segment 420 can include LSB bits 3 to 0, wherein LSB bits 3 to 0 can use an R-2R DAC structure. The R-2R. DAC structure of the third segment 420 can increase the bandwidth limitation for the lower LSB bits with low RC time constants (i.e., the bits can work at a fast rate). Additionally, the R-2R DAC structure of the third segment 420 can have a smaller area than a traditional binary structure.

When comparing the DAC 405 and the DAC 205, bits can be added to and/or subtracted from each segment of the DAC. The adjustment of a particular segment of the DAC can correspond to enhancing the advantages provided by that segment. For example, adding an LSB (e.g., LSB 5) to the second segment 415 can improve one or more of linearity, area, speed, and power of one or more of the segments of the DAC 405. Additionally, as a result of adding a bit to a segment of the DAC, another segment of the DAC may lose a bit, which may also enhance the advantages the segment by removing the bit.

Figure 5:
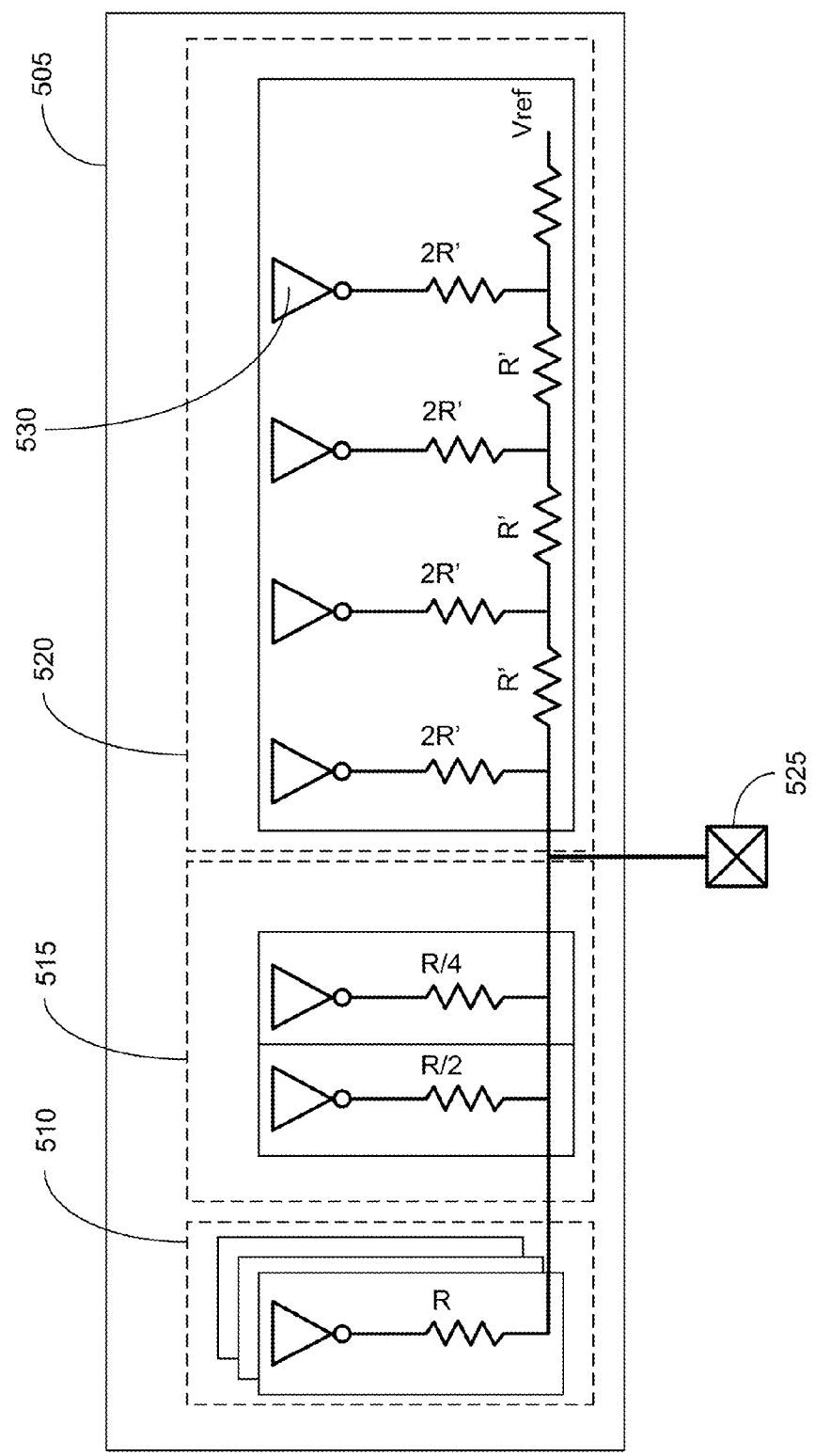
FIG. 5 depicts an exemplary block diagram of a multi-segmented all logic DAC according to one or more aspects of the disclosed subject matter.

FIG. 5 depicts an exemplary block diagram of a multi-segmented all logic DAC 505 (referred to herein as DAC 505) according to one or more aspects of the disclosed subject matter. The DAC 505 can be an exemplary implementation of the n-bit DAC 205, for example. In an embodiment, the DAC 505 can include 8 MSBs and 6 LSBs, for example. The segmentation for the DAC 505 can include a first segment 510, a second segment 515, and a third segment 520. Additionally, the DAC 505 can provide output to a node 525. The node 525 can be a summing node or an operational amplifier, for example. The DAC 505 can be one or more of all CMOS, NMOS, PMOS, etc. For example, an all CMOS implementation can correspond to providing a CMOS gate 530 for each input. Additionally, it should be appreciated that one or more of the segments can include one or more capacitors as described in FIG. 3.

The first segment 520 can correspond to eight MSB bits. The eight MSB bits of the first segment 510 can be thermometer encoded which can allow various signal processing/coding techniques to be used on the DAC 505. The thermometer encoding can provide high speed and high precision. The thermometer encoded MSBs of the first segment 510 can be composed of a predetermined number of unit-weighted slices based on the number of MSBs.

The second segment 515 can function as described in FIG. 2 regarding the second segment 215, for example.

The third segment 520 can function as describe in FIG. 4 regarding the third segment 415, for example.

When comparing the DAC 505 and the DAC 405, bits can be added to and/or subtracted from each segment of the DAC. The adjustment of a particular segment of the DAC can correspond to enhancing the advantages provided by the segment, as well as possibly enhancing the advantages of another segment via removal of a bit from that segment. For example, adjusting the first segment 510 by adding a bit can allow for more randomization, mismatching, etc.

It should be appreciated that each DAC described herein can be an exemplary DAC for a predetermined application, and each DAC can be adjusted based on the various applications for which the DAC will be used. For example, a DAC described herein may be referred to as a 14-bit DAC. However, the DAC can be configured for a different number of bits. Additionally, each segment the DAC can be adjusted (e.g., add/subtract one or more bits) based on the various applications for which the DAC will be used. For example, if a predetermined application will use a DAC with n number of bits, then the DAC can be a multi-segmented all logic DAC configured for n number of bits, and each segment (e.g., first, second, and third segment) can include the appropriate number of bits for that application. As a result, the multi-segmented all logic DAC as described herein can take advantage of the strengths provided by each segment, thereby allowing optimization of the DAC for any specific application.

The multi-segmented all logic DAC (e.g., DAC 105, DAC 205, DAC 305, DAC 405, DAC 505, etc.) provides various circuit, system, and product advantages. For example, the area can be reduced, especially when compared to a binary voltage mode DAC. Specifically, the segmentation allows for dynamic matching at higher data rates. Additionally, the multi-segmented all logic DAC as described herein can be highly linear. To the contrary, binary DACs are limited to lower resolutions. Further, the multi-segmented all logic DAC can provide additional flexibility in design as a result of moving the boundaries of various segmentation to achieve the best tradeoff between linearity, area, speed, and power. The multi-segmented all logic DAC can also reduce the linearity error. Additionally, the multi-segmented all logic DAC can improve matching between DAC bits.

Further advantages can include the multi-segmented all logic DAC having an all CMOS implementation, which allows for the design to be scalable for future generations. Another advantage can include the area being significantly smaller. The all CMOS implementation can also provide a significant power savings.

Additional advantages of the multi-segmented all logic DAC can include lower power and area compared to any other DAC architecture. The multi-segmented all logic DAC can be scalable while improving linearity and speed. For example, the multi-segmented all logic DAC can provide a solution for all DACs which require high speed/high resolution specifications. More specifically, this implementation can target wireline and wireless communication channels, as well as easily scale with the technology moving forward, for example.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

The invention claimed is:

1. A digital-to-analog converter (DAC), comprising:
a plurality of segments, wherein the plurality of segments includes
a first segment communicably coupled to each of the plurality of segments, wherein the first segment includes a predetermined number of most significant bits (MSB), a second segment communicably coupled to each of the plurality of segments, wherein the second segment includes a first predetermined number of least significant bits (LSB), and a third segment communicably coupled with each of the plurality of segments, wherein the third segment includes a second predetermined number of LSBs, the second number of LSBs in the third segment being configured in an R-2R ladder structure.

2. The DAC of claim 1, wherein the DAC includes an all logic implementation, wherein the all logic implementation include one or more of CMOS gates, PMOS gates, or NMOS gates.

3. The DAC of claim 1, wherein the first segment is thermometer encoded based on the predetermined number of MSBs.

4. The DAC of claim 1, wherein the first predetermined number of LSBs in the second segment are binary encoded parallel matched LSBs.

5. The DAC of claim 1, wherein the second segment is positioned between the first segment and the third segment.

6. The DAC of claim 1, wherein the third segment includes one or more capacitors placed across the R-2R ladder structure.

7. The DAC of claim 1, wherein the DAC includes a predetermined number of bits, wherein the predetermined number of MSBs, the first predetermined number of LSBs, and the second predetermined number of LSBs add up to the predetermined number of bits of the DAC.

8. The DAC of claim 7, wherein each of the predetermined number of MSBs, the first predetermined number of LSBs, and the second predetermined number of LSBs are determined based on a performance optimization of the DAC for an application for which the DAC is being used.

9. The DAC of claim 8, wherein the performance optimization is determined based on a tradeoff between linearity, area, speed, and power.

10. An electronic circuit, comprising:
a first segment configured to receive digital input;
a second segment coupled to the first segment, wherein the second segment is configured to receive the digital input;
a third segment couple to the second segment, wherein the third segment is configured to receive the digital input; and
wherein each of first segment, the second segment, and the third segment includes
one or more resistors, and
one or more complementary metal-oxide-semiconductor (CMOS) gates coupled to each of the one or more resistors, and
the third segment includes a second predetermined number of least significant bits (LSBs) configured in an R-2R ladder structure.

11. The electronic circuit of claim 10, wherein a combination of each of the first segment, the second segment, and the third segment is configured to convert the digital input to analog output.

12. The electronic circuit of claim 10, wherein the first segment includes a predetermined number of most significant bits (MSB).

13. The electronic circuit of claim 10, wherein the second segment includes a first predetermined number of least significant bits (LSB).

14. The electronic circuit of claim 12, wherein the first segment is thermometer encoded based on the predetermined number of MSBs.

15. The electronic circuit of claim 13, wherein the first predetermined number of LSBs in the second segment is binary encoded parallel matched LSBs.

16. The electronic circuit of claim 10, the third segment includes one or more capacitors placed across the R-2R ladder structure.

17. The electronic circuit of claim 10, wherein a number of the one or more resistors and corresponding CMOS gates for each resistor for each of the first segment, the second segment, and the third segment is based on a performance optimization of the digital-to-analog conversion for an application for which the electronic circuit is being used.

* * * * *